United States Patent
Ripley et al.

(10) Patent No.: US 7,605,651 B2
(45) Date of Patent: Oct. 20, 2009

(54) MULTIMODE AMPLIFIER FOR OPERATION IN LINEAR AND SATURATED MODES

(75) Inventors: David S. Ripley, Cedar Rapids, IA (US); Pat Reginella, Monument, CO (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 11/999,111

(22) Filed: Dec. 4, 2007

(65) Prior Publication Data

US 2008/0180169 A1 Jul. 31, 2008

Related U.S. Application Data

(60) Provisional application No. 60/897,711, filed on Jan. 25, 2007.

(51) Int. Cl.
H03G 3/20 (2006.01)
(52) U.S. Cl. .................. 330/133; 330/285; 330/150
(58) Field of Classification Search ............... 330/133, 330/98, 150, 310–311
See application file for complete search history.

(56) References Cited

U.S. PATENT DOCUMENTS

| | | | |
|---|---|---|---|
| 6,724,252 B2 * | 4/2004 | Ngo et al. | 330/133 |
| 6,885,246 B2 | 4/2005 | Tsutsui et al. | |
| 7,113,034 B2 * | 9/2006 | Arai et al. | 330/133 |
| 7,151,411 B2 * | 12/2006 | Martin et al. | 330/305 |
| 7,193,459 B1 | 3/2007 | Epperson | |
| 7,196,583 B2 * | 3/2007 | Clifton et al. | 330/285 |
| 7,227,415 B2 * | 6/2007 | Tahara et al. | 330/285 |
| 2003/0184382 A1 | 10/2003 | Tsutsui et al. | |

FOREIGN PATENT DOCUMENTS

| JP | 15298360 | 10/2003 |
|---|---|---|
| JP | 17229267 | 8/2005 |

* cited by examiner

*Primary Examiner*—Robert Pascal
*Assistant Examiner*—Hieu P Nguyen

(57) ABSTRACT

According to an exemplary embodiment, a multimode power amplifier configured to receive an RF input signal and provide an RF output signal in linear and saturated operating modes includes an output stage configured to receive a fixed supply voltage and to provide the RF output signal. The multimode power amplifier further includes at least one driver stage coupled to the output stage, where the at least one driver stage is configured to receive the RF input signal and an adjustable supply voltage. The adjustable supply voltage controls an RF output power of the RF output signal when the multimode power amplifier is in the saturated operating mode. The at least one driver and the output stage are each biased by a low impedance voltage in the linear and saturated operating modes. The adjustable supply voltage can be controlled by a fixed control voltage in the linear operating mode.

18 Claims, 4 Drawing Sheets

MULTIMODE AMPLIFIER FOR OPERATION IN LINEAR AND SATURATED MODES

The present application claims the benefit of and priority to a pending provisional patent application entitled "Biasing Architecture for a Multimode Power Amplifier," Ser. No. 60/897,711 filed on Jan. 25, 2007. The disclosure in that pending provisional application is hereby incorporated fully by reference into the present application.

BACKGROUND OF THE INVENTION

1. Field of the Invention

The present invention generally relates to the field of electrical circuits. More particularly, the invention relates to amplifier circuits.

2. Background Art

Communication devices, such as cellular telephones, generally utilize power amplifiers that operate in a linear mode, where output power is controlled by input power, and power amplifiers that operate in a saturated mode, where input power is constant and output power is controlled by a control voltage, to support different modulation standards. For example, power amplifiers that can operate in a linear mode can be used in cellular telephones that use Enhanced Data Rates for GSM Evolution (EDGE) modulation, while power amplifiers that can operate in saturated mode can be use in cellular telephones that use Gaussian minimum shift keying (GMSK) modulation. However, it is desirable for power amplifiers in communication devices, such as cellular telephones, to be able to operate in either a linear or a saturated mode to accommodate different modulation standards, such as EDGE and GMSK.

Several conventional approaches have been made to provide a multimode power amplifier that can support both linear and saturated operating modes. One conventional approach utilizes a heterojunction bipolar transistor (HBT) amplifier incorporating a switched bias technique, where a low impedance voltage bias is provided for linear mode operation and a high impedance voltage bias is provided for saturated mode operation. However, the switched bias technique utilized in this approach can require a complex circuit to switch the bias between operating modes, which can undesirably result in an increased component count, compromised noise performance, and slew rate limits on mode transitions.

In another conventional approach to provide a multimode power amplifier, a low impedance voltage bias is maintained at the power amplifier for linear mode operation, while the power amplifier supply voltage is regulated to control the output power in saturated mode operation. While this approach avoids switching the bias between linear and saturated operating modes, it requires a high current low drop out regulator (LDO) to support the current requirements of the output stage amplifier and introduces an undesirable voltage drop in the supply voltage of the amplifier, thereby reducing overall amplifier efficiency and the linear operating mode performance.

SUMMARY OF THE INVENTION

A multimode amplifier for operation in linear and saturated modes, substantially as shown in and/or described in connection with at least one of the figures, as set forth more completely in the claims.

DETAILED DESCRIPTION OF THE INVENTION

The present invention is directed to a multimode amplifier for operation in linear and saturated modes. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
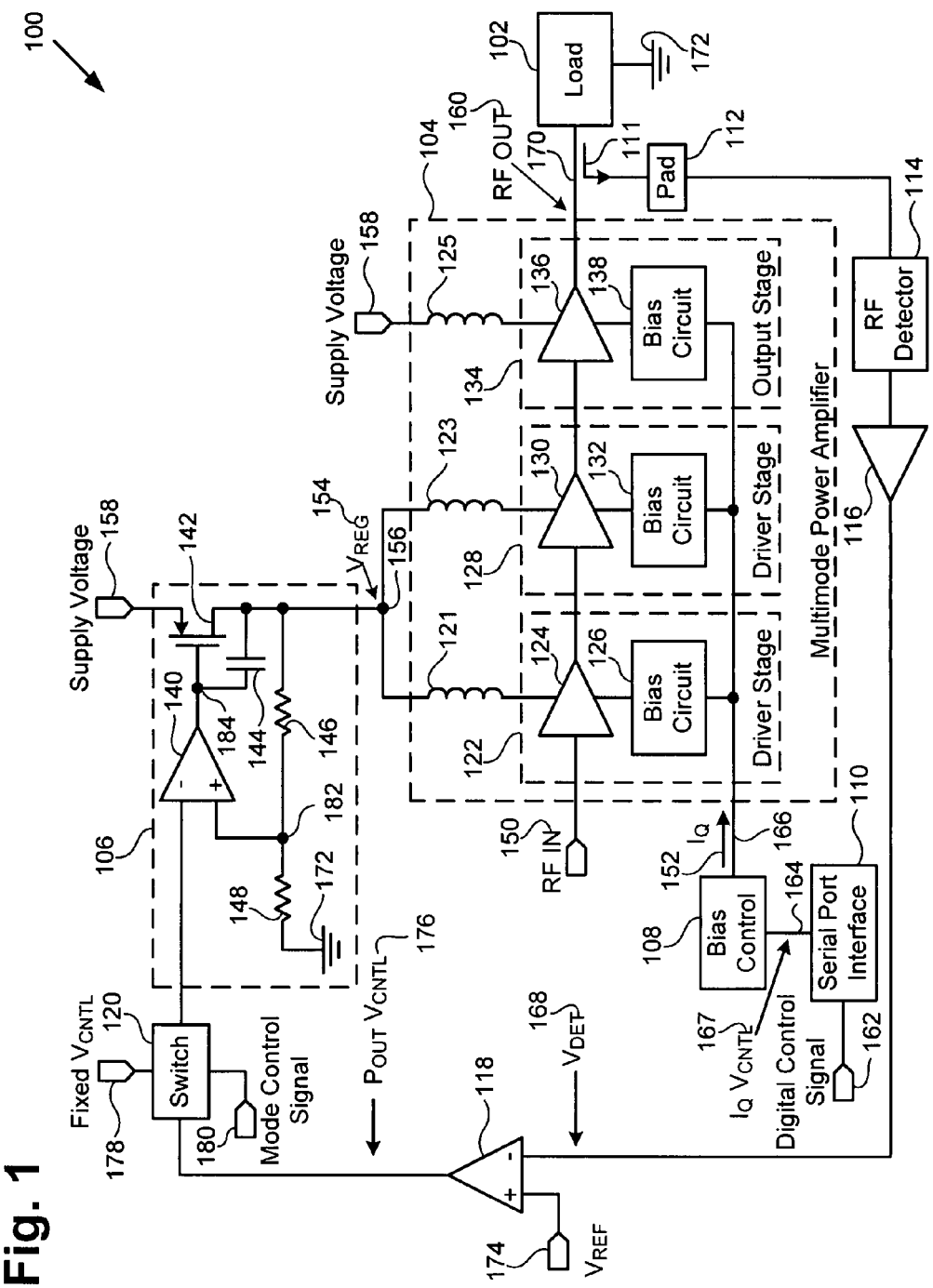
FIG. 1 is a block diagram of an exemplary amplification module including a multimode power amplifier in accordance with one embodiment of the present invention.

FIG. 1 shows a block diagram of an exemplary amplification module coupled to a load in accordance with one embodiment of the present invention. Certain details and features have been left out of FIG. 1, which are apparent to a person of ordinary skill in the art. Amplification module 100, which is coupled to load 102, includes multimode power amplifier 104 (also referred to simply as "power amplifier 104"), regulator 106, bias control 108, serial port interface 110, directional coupler 111, pad 112, RF detector 114, buffer 116, integrator 118, and switch 120. Power amplifier 104 includes driver stage 122, which includes driver stage amplifier 124 (also referred to simply as "driver amplifier 124") and bias circuit 126, driver stage 128, which includes driver stage amplifier 130 (also referred to simply as "driver amplifier 130") and bias circuit 132, and output stage 134, which includes output stage amplifier 136 (also referred to simply as "output amplifier 136"), bias circuit 138, and inductors 121, 123, and 125. Regulator 106 includes differential amplifier 140, transistor 142, capacitor 144, and resistors 144 and 148. It is noted that although power amplifier 104 only includes only two driver stages (i.e. driver stages 122 and 128) in the present application, the present invention also applies to a multimode power amplifier having only one driver stage or more than two driver stages coupled to an output stage.

Amplification module 100 can be utilized in communication devices, such as mobile telephones, that utilize EDGE, GMSK, Code Division Multiple Access (CDMA), or other suitable modulation standards. Amplification module 100 can be fabricated on one or more semiconductor die using silicon technology, gallium arsenide (GaAs) technology, or other appropriate technology. In one embodiment, amplification module 100 can be fabricated using mixed technologies. For example, driver stages 122 and 128 of power amplifier 104 and regulator 106 can be fabricated on a silicon die and output stage 134 of multimode power amplifier 104 can be fabricated on a GaAs die.

As shown in FIG. 1, RF input signal ("RF IN") 150 is coupled to the input of power amplifier 104, which is an amplifier that can operate in either a linear mode or a saturated mode. Power amplifier 104 can be configured to receive RF IN 150, quiescent current ($I_Q$) 152 from bias control 108, regulated voltage ($V_{REG}$) 154, which is an adjustable supply voltage, from regulator 106 at node 156, and supply voltage 158, amplify RF IN 150, and generate RF output signal (RF OUT) 160, which is coupled to load 102. Supply voltage 158 is a fixed, i.e., a non-adjustable, supply voltage. However, as can be appreciated by one or ordinary skill in the art, supply voltage 158 can vary by a small amount as a result of variations in the source of supply voltage 158, such as a battery.

Also shown in FIG. 1, RF IN 150 is coupled to the input of driver amplifier 124, which is also the input of driver stage 122, and the output of driver amplifier 124, which is also the output of driver stage 122, is coupled to the input of driver stage 128. Driver amplifier 124 can be configured to receive RF IN 150, a low impedance voltage bias from bias circuit 126, which is coupled to a bias input of driver amplifier 124, and $V_{REG}$ 154, which is an adjustable supply voltage that is coupled to a supply voltage input of driver amplifier 124 via inductor 121, amplify RF IN 150, and generate a first intermediate RF signal. Driver amplifier 124 can comprise a transistor, such as a bipolar transistor or a field effect transistor (FET). However, driver amplifier 124 may also be implemented by utilizing more than one transistor. Bias circuit 126 can be configured to receive $I_Q$ (quiescent current) 152, which is drawn from bias control 108, and provide a low impedance voltage bias to driver amplifier 124.

Further shown in FIG. 1, the first intermediate RF signal generated by driver stage 122 is coupled to the input of driver amplifier 130, which is also the input of driver stage 128, and the output of driver amplifier 130, which is also the output of driver stage 128, is coupled to the input of output amplifier 136 in output stage 134. Driver amplifier 130 can be configured to receive the first intermediate RF signal from driver stage 122, a low impedance voltage bias from bias circuit 132, which is coupled to a bias input of driver amplifier 130, and $V_{REG}$ 154, which is coupled to a supply voltage input of driver amplifier 130 via inductor 123, amplify the first intermediate RF signal, and generate a second intermediate RF signal. Driver amplifier 130 can comprise a transistor, such as a bipolar transistor or a FET. However, driver amplifier 130 may also be implemented by utilizing more than one transistor. Bias circuit 132 can be configured to receive $I_Q$ 152 from bias control 108 and provide a low impedance voltage bias to driver amplifier 130.

Also shown in FIG. 1, the second intermediate RF signal generated by driver stage 128 is coupled to the input of output amplifier 136, which is also the input of output stage 134, and the output of output amplifier 136, which is also the output of output stage 134, is coupled to load 102. Output amplifier 136 can be configured to receive the second intermediate RF signal from driver stage 128, a low impedance voltage bias from bias circuit 138, which is coupled to a bias input of output amplifier 136, and supply voltage 158, i.e., a fixed supply voltage, which is coupled to a supply voltage input of output amplifier 136 via inductor 125, amplify the second intermediate RF signal, and generate RF OUT 160. Output amplifier 136 can comprise a transistor, such as a bipolar transistor or a FET. However, output amplifier 136 may also be implemented by utilizing more than one transistor. Bias circuit 138 can be configured to receive $I_Q$ 152 from bias control 108 and provide a low impedance voltage bias to output amplifier 136.

Further shown in FIG. 1, digital control signal 162 is coupled to the input of serial port interface 110, the output of serial port interface 110 is coupled to the input of bias control 108 via line 164, and the output of bias control 108 is coupled to the inputs of bias circuits 126, 132, and 138 in respective driver stages 122 and 128 and output stage 134 of power amplifier 104 via bus 166. Digital control signal 162 can be coupled to the input of serial port interface 110 via, for example, a three-wire bus. Digital control signal 162 can control the amount of quiescent current (i.e. $I_Q$ 152) provided to power amplifier 104 by bias control 108. For example, digital control signal 162 can be selected to cause bias control 108 to provide a low quiescent current to power amplifier 104 for low output power operation and a high quiescent current to power amplifier 104 for high output power operation. In one embodiment, digital control signal 162 can have a number of selectable values corresponding to a number of desired output power levels of power amplifier 104.

Serial port interface 110 can include a digital interface and a digital-to-analog (D/A) converter and can be configured to receive and convert digital control signal 162 to an analog quiescent current ($I_Q$) control voltage ($V_{CNTL}$), and to output analog $I_Q V_{CNTL}$ 167 (also referred to simply as "$I_Q V_{CNTL}$ 167") on line 164. Bias control 108 comprises a voltage-to-current converter for supplying quiescent current to power amplifier 104. Bias control 108 can be configured to receive and convert $I_Q V_{CNTL}$ 167 (i.e. an analog quiescent current control voltage) to a quiescent current and to provide $I_Q$ 152 to driver stages 122 and 128 and output stage 134 of power amplifier 104. $I_Q V_{CNTL}$ 167 can control the bias voltage provided by bias circuits 126, 132, and 138 to respective driver amplifiers 124 and 130 and output amplifier 136 by controlling the amount of quiescent current (i.e. $I_Q$ 152) supplied to bias circuits 126, 132, and 138. Thus, an increase in $I_Q V_{CNTL}$ 167 can cause a corresponding increase in $I_Q$ 152 provided to the driver and output stages of power amplifier 104.

In one embodiment, a switch, which can be implemented by, for example, a FET, can be inserted in line 164 such that serial port interface 110 is coupled to bias control 108 when power amplifier 104 is operating in a linear mode. When power amplifier 104 is operating in a saturated mode, the switch can decouple serial port interface 110 from bias control 108 and couple detected peak voltage ($V_{DET}$) 168, which is proportional to the RF output power generated by power amplifier 104, to bias control 108. Thus, in the saturated operating mode, $I_Q$ 152 (i.e. the quiescent current provided to power amplifier 104) can be proportional to the RF output power generated by power amplifier 104.

Also shown in FIG. 1, a first terminal of load 102, which can be an antenna, is coupled to the output of power amplifier 104 via line 170 and a second terminal of load 102 is coupled to ground 172. Further shown in FIG. 1, RF OUT 160 on line 170 is coupled to the input of directional coupler 111 and pad 112 is coupled between the output of directional coupler 111 and the input of RF detector 114. Directional coupler 111 can comprise an RF structure for coupling the forward power, i.e., the RF output power provided to load 102 by power amplifier 104, on line 170 to RF detector 114 via pad 112. On line 170, the forward power is the RF power provided to load 102, e.g., an antenna, by power amplifier 104 on line 170 and the reflected power is the RF power that is reflected back to power amplifier 104 from load 102 on line 170. A sine wave corresponding to the forward power and a sine wave corresponding to the reflected power can add and subtract along line 170, resulting in a voltage standing wave ratio (VSWR).

Pad 112 can comprise an attenuator, which can be selected to ensure that the RF output signal coupled from directional coupler 111 is compatible with the input signal range of RF detector 114. Also shown in FIG. 1, the output of RF detector 114 is coupled to the input of buffer 116 and the output of buffer 116 is coupled to the negative (inverting) input of integrator 118. RF detector 114, which can comprise, for example, a diode detector or a log amplifier detector, can be configured to receive an RF output signal, which is directly proportional to RF OUT 160, from pad 112 and to output a detected DC voltage that is directly proportional to the peak RF voltage of RF OUT 160. Buffer 116, which can be, for example, an operational amplifier, and can be configured to receive the detected DC voltage from RF detector 114 and to transfer the detected DC voltage ($V_{DET}$) 168 to the negative input of integrator 118. Buffer 116, which can have a voltage gain of approximately 1.0, can prevent integrator 118 from loading down RF detector 114 and, thereby, interfering with the operation of the RF detector.

Further shown in FIG. 1, reference voltage ($V_{REF}$) 174 and $V_{DET}$ 168 are coupled to the respective positive (non-inverting) and negative (inverting) inputs of integrator 118 and the output of integrator 118 is coupled to an input of switch 120. $V_{REF}$ 174, which is an analog reference voltage, can be utilized to adjust the RF output power of RF OUT 160 to a desired predetermined level. Integrator 118, which can be an analog integrator in the embodiment in FIG. 1, can be configured to compare $V_{DET}$ 168 with $V_{REF}$ 174 and to provide power output control voltage ($P_{OUT}V_{CNTL}$) 176, where $P_{OUT}V_{CNTL}$ 176 is adjusted to cause $V_{DET}$ 168 to be substantially equal to $V_{REF}$ 174. In one embodiment, integrator 118 can be replaced by a digital integrator, which is discussed below in reference to FIG. 3.

Also shown in FIG. 1, fixed control voltage ($V_{CNTL}$) 178 is coupled to an input of switch 120, mode control signal 180 is coupled to a control terminal of switch 120, and the output of switch 120 is coupled to a negative (inverting) input of differential amplifier 140 in regulator 106. Fixed $V_{CNTL}$ 178 is a substantially constant voltage that is selected so as to cause $V_{REG}$ 154 to be equal to or greater than a supply voltage required to cause driver stages 122 and 128 of power amplifier 104 to operate in a linear mode. However, as can be appreciated by one or ordinary skill in the art, fixed $V_{CNTL}$ 178 can vary by a small amount as a result of, for example, variations in a supply voltage source, such as a battery. Switch 120 can be a single-pole double-throw (SPDT) switch and can be implemented by, for example, FETs. Switch 120 can be configured to couple fixed $V_{CNTL}$ 178 to the negative input of differential amplifier 140 in a linear operating mode of power amplifier 104 and to couple $P_{OUT}V_{CNTL}$ 176 to the negative input of differential amplifier 140 in a saturated operating mode of power amplifier 104 in response to mode control signal 180. For example, mode control signal 180 can comprise a high voltage to indicate a linear mode and a low voltage to indicate a saturated mode or vice versa.

Further shown in FIG. 1, in regulator 106, the output of differential amplifier 140 is coupled to the gate of transistor 142, which can be, for example, a P-channel FET (PFET), and a first terminal of capacitor 144 at node 184, the source of transistor 142 is coupled to supply voltage 158, and the drain of transistor 142 is coupled to a second terminal of capacitor 144, a first terminal of resistor 146, and power amplifier 104 at node 156, which provides $V_{REG}$ 154. Also shown in FIG. 1, a second terminal of resistor 146 is coupled to a first terminal of resistor 148 and the positive (non-inverting) input of differential amplifier 140 at node 182 and a second terminal of resistor 148 is coupled to ground 172. In regulator 106, which is a negative feedback voltage regulator, the gain of differential amplifier 140 is determined by the ratio of the values of resistors 148 and 146.

The operation of amplification module 100 will now be discussed. In amplification module 100, power amplifier 104 is a multimode power amplifier that can operate in a saturated mode and in a linear mode. In the saturated and linear operating modes of power amplifier 104, a low impedance voltage bias is provided to driver amplifiers 124 and 130 in respective driver stages 122 and 128 and to output amplifier 136 in output stage 134 by respective bias circuits 126, 132, and 138, which receive $I_Q$ 152 from bias control 108.

In the saturated operating mode, an adjustable supply voltage, i.e., $V_{REG}$ 154, at node 156 is adjusted to control the peak amplitude of the RF signal inputted into output amplifier 236 from driver amplifier 130. However, in the saturated operating mode, $V_{REG}$ 154 is controlled by $P_{OUT}V_{CNTL}$ 176 (output power control voltage), which is provided by integrator 118 so as to cause $V_{DET}$ 168 to be substantially equal to $V_{REF}$ 174. However, $V_{DET}$ 168 is directly proportional to the peak amplitude of RF OUT 160. Thus, by utilizing $P_{OUT}V_{CNTL}$ 176 to control $V_{REG}$ 154, which is applied to the voltage supply inputs of driver stages 122 and 128, the RF output power of RF OUT 160, which is provided by power amplifier 104, is thereby controlled. Thus, in the saturated operating mode, $P_{OUT}V_{CNTL}$ 176 can be utilized to cause the RF output power of RF OUT 160 to be substantially constant.

In the linear operating mode, $V_{REG}$ 154 is controlled by fixed $V_{CNTL}$ 178, which is selected to cause $V_{REG}$ 154 to be equal to or greater than a supply voltage that is required to cause driver stages 122 and 128 to operate linearly, i.e., to operate as linear amplifier stages. In other words, $V_{CNTL}$ 178 is selected so as to cause $V_{REG}$ 154 to be greater than a supply voltage that would saturate driver amplifiers 124 and 130.

Thus, an embodiment of the invention's multimode power amplifier 104 maintains a low impedance voltage bias for driver stage amplifiers 124 and 130 and output stage amplifier 136 for both saturated and linear operating modes and utilizes an adjustable supply voltage for only driver stage amplifiers 124 and 130. As a result, the invention avoids requiring a large LDO to provide supply voltage to the output stage of the multimode power amplifier, thereby increasing the efficiency of the output stage compared to a conventional multimode power amplifier that utilizes a large LDO to control saturated output power.

Figure 2:
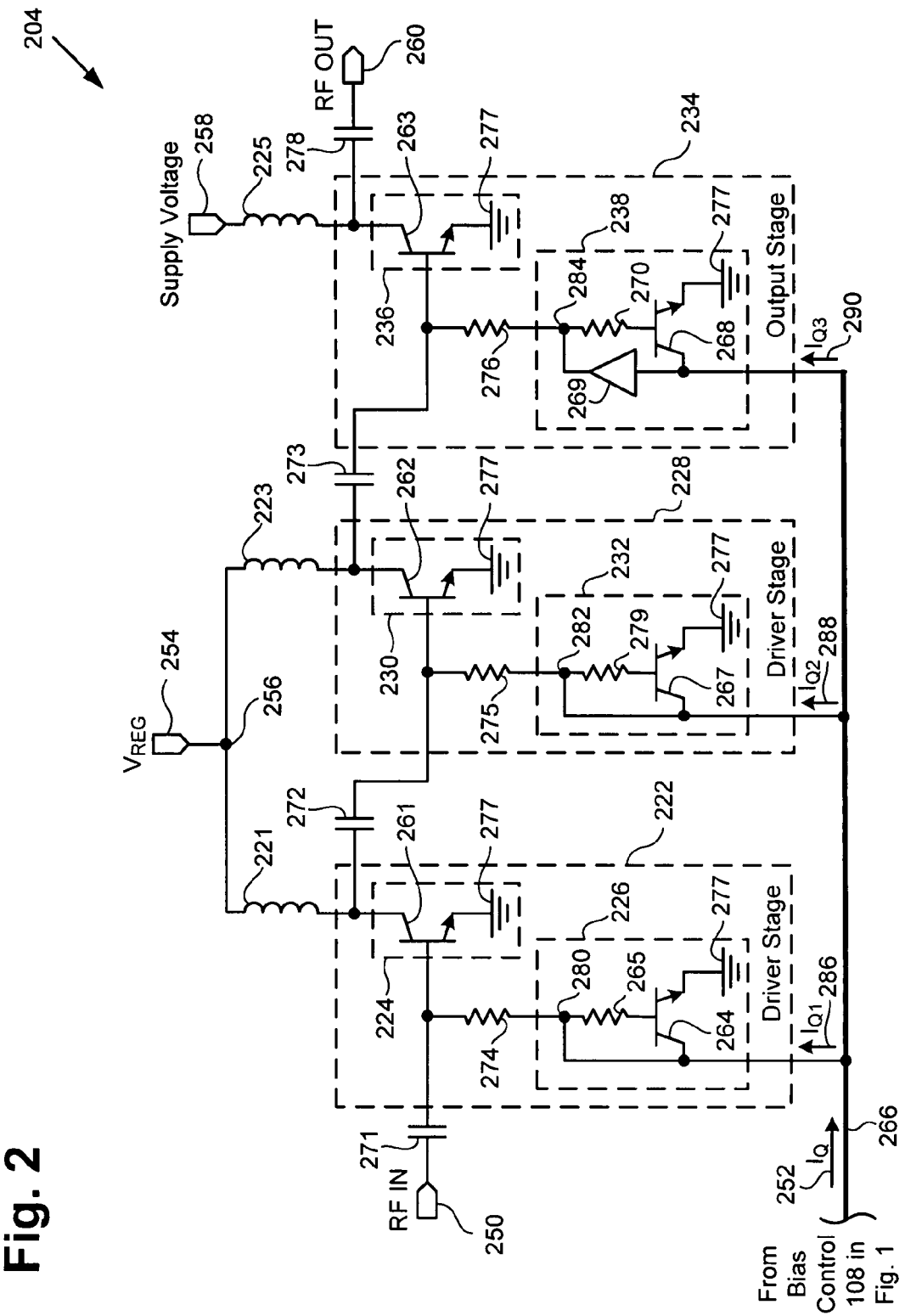
FIG. 2 illustrates a circuit diagram of an exemplary multimode power amplifier in accordance with one embodiment of the present invention.

FIG. 2 shows a schematic diagram of an exemplary power amplifier in accordance with one embodiment of the present invention. Power amplifier 204 in FIG. 2 corresponds to power amplifier 104 in FIG. 1. In particular, inductors 221, 223, and 225, driver stages 222 and 228, output stage 234, bias circuits 226, 232, and 238, driver amplifiers 224 and 230, output amplifier 236, RF IN 250, $I_Q$ 252, $V_{REG}$ 254, supply voltage 258, and RF OUT 260 in FIG. 2 correspond, respectively, to inductors 121, 123, and 125, driver stages 122 and 128, output stage 134, bias circuits 126, 132, and 138, driver amplifiers 124 and 130, output amplifier 136, RF IN 150, $I_Q$ 152, $V_{REG}$ 154, supply voltage 158, and RF OUT 160 in FIG. 1.

As shown in FIG. 2, power amplifier 204 comprises driver stages 222 and 228, output stage 234, inductors 221, 223, and 225, and capacitors 271, 272, 273, and 278. Driver stage 222 comprises driver amplifier 224, bias circuit 226, and resistor 274, driver stage 228 comprises driver amplifier 230, bias circuit 232, and resistor 275, and output stage 234 comprises output amplifier 236, bias circuit 238, and resistor 276. Driver amplifiers 224 and 230 comprise respective transistors 261 and 262, output amplifier 236 comprises transistor 263, which is a power transistor, bias circuit 226 comprises transistor 264 and resistor 265, bias circuit 232 comprises transistor 267 and resistor 279, and bias circuit 238 comprises transistor 268, buffer 269, and resistor 270.

In the present embodiment, transistors 261, 262, 263, 264, 267, and 268 can comprise bipolar transistors, such as NPN transistors, and can be fabricated on one semiconductor die, such as a silicon die. In other embodiments, transistors 261, 262, 263, 264, 267, and 268 can comprise FETs. In one embodiment, transistors 261 and 262, i.e., the driver transistors in respective driver stages 222 and 228, can be fabricated on a silicon die and transistor 263, the power transistor in output stage 234, can be fabricated on a gallium arsenide die. In one embodiment, transistors 261, 262, and 263 can be fabricated on a gallium arsenide die. Since transistor 263 is a power transistor, it can be significantly larger in size than either transistor 261 or transistor 262.

As shown in FIG. 2, RF IN 250 is coupled to the base of transistor 261 via capacitor 271, the collector of transistor 261 is coupled to $V_{REG}$ 254 via inductor 221 and coupled to the base of transistor 262 via capacitor 272, and the emitter of transistor 261 is coupled to ground 277. Also shown in FIG. 2, the base of transistor 261 is coupled to a first terminal of resistor 274, a second terminal of resistor 274 is coupled to a first terminal of resistor 265 and the collector of transistor 264 at node 280, a second terminal of resistor 265 is coupled to the base of transistor 264, and the emitter of transistor 264 is coupled to ground 277.

Further shown in FIG. 2, the collector of transistor 262 is coupled to $V_{REG}$ 254 via inductor 223 and coupled to the base of transistor 263 via capacitor 273, and the emitter of transistor 262 is coupled to ground 277. Also shown in FIG. 2, the base of transistor 262 is coupled to a first terminal of resistor 275, a second terminal of resistor 275 is coupled to a first terminal of resistor 279 and the collector of transistor 267 at node 282, a second terminal of resistor 279 is coupled to the base of transistor 267, and the emitter of transistor 264 is coupled to ground 277.

Also shown in FIG. 2, the collector of transistor 263 is coupled to supply voltage 258 via inductor 225 and a first terminal of capacitor 278, RF OUT 260 is provided at a second terminal of capacitor 278, and the emitter of transistor 263 is coupled to ground 277. Further shown in FIG. 2, the base of transistor 263 is coupled to a first terminal of resistor 276, a second terminal of resistor 276 is coupled to a first terminal of resistor 270, the output of buffer 269 at node 284, the collector of transistor 268 is coupled to the input of buffer 269 and bus 266, a second terminal of resistor 270 is coupled to the base of transistor 268, and the emitter of transistor 268 is coupled to ground 277. Also shown in FIG. 2, $I_Q$ 252 (quiescent current) is provided by bias control 108 in FIG. 1 on bus 266, which provides $I_{Q1}$ 286, $I_{Q2}$ 288, and $I_{Q3}$ 290 to respective bias circuits 226, 232, and 238.

Power amplifier 204 is a multimode power amplifier, which can operate in either a linear mode or a saturated mode. During linear and saturated modes of operation, bias circuits 226, 232, and 238 in driver stages 222 and 228 and output stage 234 provide low impedance voltage biases to the bases of transistors 261, 262, and 263, respectively. In bias circuit 226, for example, the base of transistor 264 is coupled to the collector of transistor 264 via resistor 265, thereby configuring transistor 264 to function as a diode. As a result, quiescent current, i.e., $I_{Q1}$ 286, drawn from control bias 108 in FIG. 1 flows through the diode formed by transistor 264, thereby providing a low impedance voltage at node 280. The low impedance voltage at node 280 is coupled to the base of transistor 261 via resistor 274 to provide a low impedance voltage bias. In a similar manner, bias circuits 228 and 238 provide low impedance voltage biases at the respective bases of transistors 262 and 263 in driver stage 228 and output stage 234. However, in bias circuit 238, buffer 269 is provided between bus 266 and node 284 to function as a beta helper to supply a large base current required by transistor 263.

During operation of power amplifier 204, an adjustable supply voltage, i.e., $V_{REG}$ 254, is provided to the collectors of driver stage transistors 261 and 262 via respective inductors 221 and 223 and a fixed supply voltage, i.e., supply voltage 258, is provided to the collector of output stage power transistor 263 via inductor 225. In the saturated operating mode, $V_{REG}$ 254 is adjusted to control the peak amplitude of the RF signal inputted into output amplifier 236. However, in the saturated operating mode, $V_{REG}$ 254 is controlled by $P_{OUT}$ $V_{CNTL}$ 176 (output power control voltage), which is determined by a detected voltage that is proportional to the amplitude of RF OUT 260. Thus, $V_{REG}$ 254 controls the RF output power of RF OUT 260 in the saturated operating mode.

In the linear operating mode, the adjustable supply voltage, i.e., $V_{REG}$ 254, is controlled by fixed $V_{CNTL}$ 178 in FIG. 1, which is selected to cause $V_{REG}$ 254 to be equal to or greater than a supply voltage required to cause driver stages 222 and 228 to operate linearly. In other words, $V_{CNTL}$ 178 is selected so as to cause $V_{REG}$ 254 to be greater than a supply voltage that would saturate driver amplifiers 224 and 230.

Figure 3:
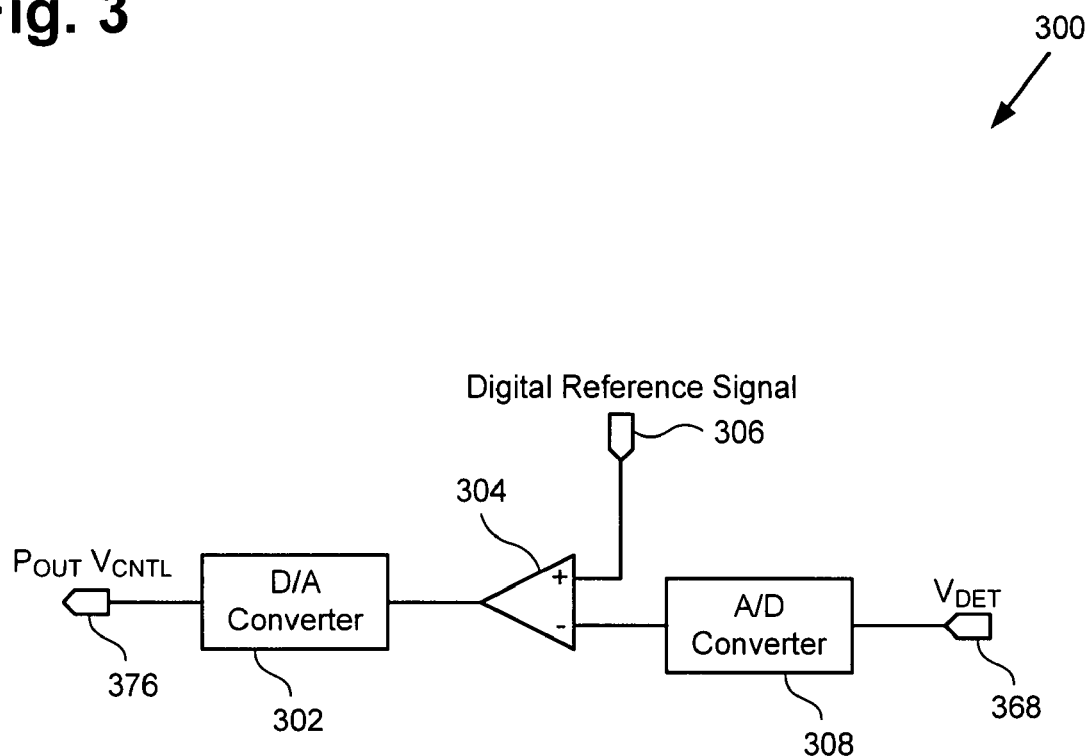
FIG. 3 is a block diagram of an exemplary integrator circuit in accordance with one embodiment of the present invention.

FIG. 3 shows a block diagram of an exemplary integrator circuit in accordance with one embodiment of the present invention. In FIG. 3, $P_{OUT} V_{CNTL}$ 376 and $V_{DET}$ 368 correspond, respectively, to $P_{OUT} V_{CNTL}$ 176 and $V_{DET}$ 168 in amplification module 100 in FIG. 1. Integrator circuit 300 provides an alternative digital implementation of integrator 118 (i.e. an analog integrator) in FIG. 1. Thus, in one embodiment of amplification module 100, integrator circuit 300 can be utilized in place of integrator 118. Integrator circuit 300 comprises D/A converter 302, integrator 304, which is a digital integrator, and analog-to-digital (A/D) converter 308.

As shown in FIG. 3, $V_{DET}$ 368, which is an analog voltage that is linearly proportional to the peak amplitude of the RF output signal (i.e. RF OUT 160) provided by power amplifier 104 in FIG. 1, is coupled to the input of A/D converter 308, and the output of A/D converter 308 is coupled to the negative (inverting) input of integrator 304. A/D converter 308 can convert $V_{DET}$ 368 into a corresponding digital voltage. Also shown in FIG. 3, digital reference signal 306 is coupled to the positive (non-inverting) input of integrator 304, the output of integrator 304 is coupled to the input of D/A converter 302, and the output of D/A converter 302 provides $P_{OUT} V_{CNTL}$ 376 (an output power control voltage).

Digital reference signal 306 is a digital word which can be utilized to adjust the RF output power of RF OUT 160 to a desired level. Integrator 304 can be configured to compare a digital voltage corresponding to $V_{DET}$ 368 against digital reference signal 306 and to provide a digital power output control voltage, which is converted to an analog power control voltage (i.e. $P_{OUT}V_{CNTL}$ 376) by D/A converter 302. $P_{OUT}V_{CNTL}$ 376 can be adjusted so as to cause $V_{DET}$ 368 to be substantially equal to digital reference signal 306.

Figure 4:
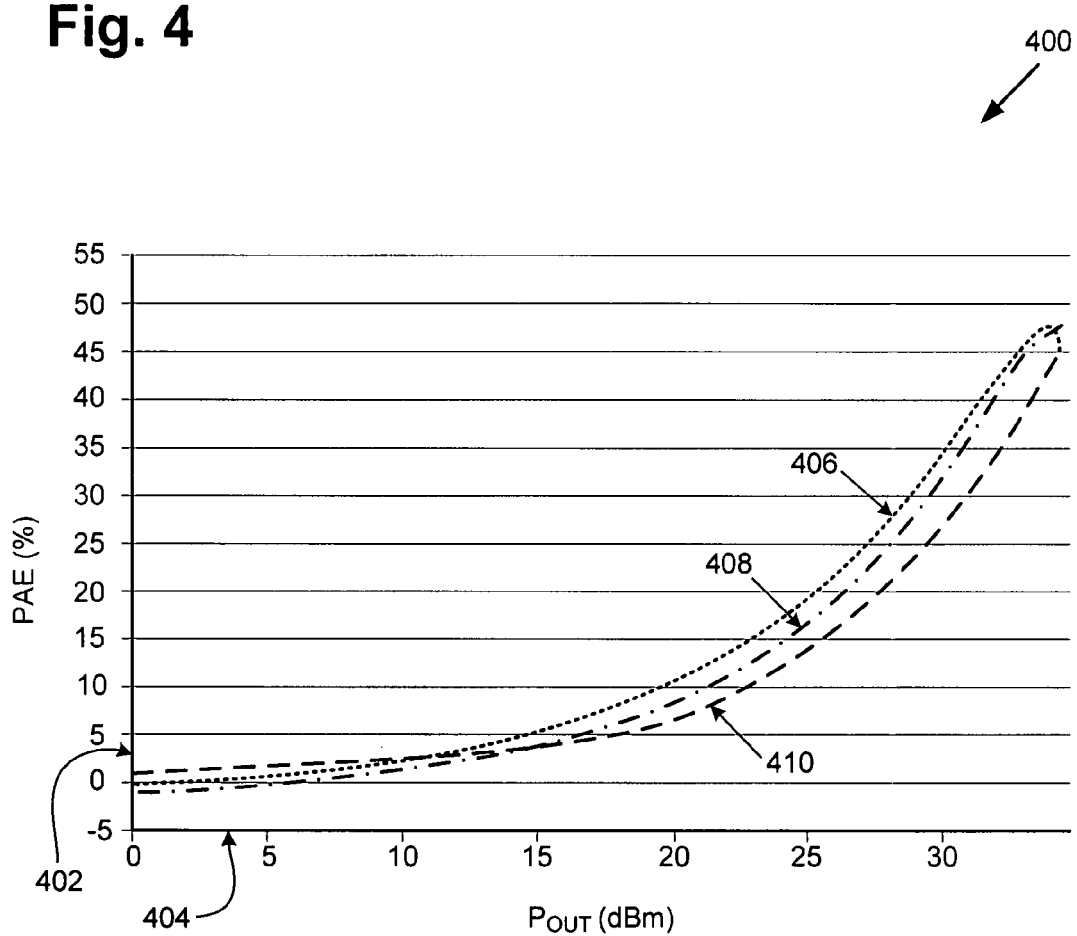
FIG. 4 is a graph showing power amplifier efficiency curves in accordance with one embodiment of the present invention.

FIG. 4 shows an exemplary graph including amplifier efficiency curves in accordance with one embodiment of the present invention. Graph 400 includes power added efficiency (PAE) axis 402, power output ($P_{OUT}$) axis 404, and amplifier efficiency curves 406, 408, and 410. In graph 400, PAE axis 402 corresponds to a ratio of the RF power outputted by an antenna coupled to the output of the power amplifier divided by the sum of the DC supply and RF power inputted into the power amplifier, while $P_{OUT}$ 404 corresponds to an output power range of the power amplifier.

In graph 400, amplifier efficiency curve 406 corresponds to the efficiency of a conventional power amplifier operating with GMSK only modulation and providing a high impedance voltage bias on all stages (hereinafter referred to as a "conventional GMSK power amplifier"). In graph 400, amplifier efficiency curve 408 corresponds to the efficiency of an embodiment of the invention's multimode power amplifier and amplifier efficiency curve 410 corresponds to the efficiency of a conventional power amplifier utilizing final stage collector voltage control (hereinafter referred to as a "conventional final collector control power amplifier").

In the example shown in graph 400, the invention's multimode power amplifier provides an efficiency performance comparable to the efficiency performance of the conventional GMSK power amplifier while providing higher efficiency performance by approximately 5.0 percent at an output power of approximately 30.0 dBm compared to the efficiency performance of the conventional final collector control power amplifier. However, the conventional GMSK power amplifier is a single mode, i.e., saturated mode, power amplifier. Thus, the present invention provides a multimode power amplifier that can operate in both a linear and a saturated mode while providing a comparable efficiency performance to a single mode conventional GMSK power amplifier.

Thus, as discussed above, the present invention provides multimode power amplifier that provides a low impedance voltage bias to the driver and output stage amplifiers, provides an adjustable supply voltage to the driver stages, and provides a fixed supply voltage to the output stage. As a result, the invention provides a multimode power amplifier that can advantageously operate efficiently and effectively in both linear and saturated operating modes.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a multimode amplifier for operation in linear and saturated modes has been described.

The invention claimed is:

1. A multimode power amplifier configured to receive an RF input signal and provide an RF output signal in linear and saturated operating modes, said multimode power amplifier comprising:

an output stage configured to receive a fixed supply voltage and to provide said RF output signal;

at least one driver stage coupled to said output stage, said at least one driver stage configured to receive said RF input signal and an adjustable supply voltage;

wherein said adjustable supply voltage controls an RF output power of said RF output signal when said multimode power amplifier is in said saturated operating mode; and wherein said adjustable supply voltage is controlled by a fixed control voltage when said multimode power amplifier is in said linear operating mode.

2. The multimode power amplifier of claim 1, wherein said at least one driver stage and said output stage are each biased by a low impedance voltage in said linear and saturated operating modes.

3. The multimode power amplifier of claim 1, wherein said fixed control voltage causes said at least one driver stage to operate linearly.

4. The multimode power amplifier of claim 1, wherein adjustable supply voltage is controlled by an output power control voltage in said saturated operating mode.

5. The multimode power amplifier of claim 4, wherein said output power control voltage is determined by a peak amplitude of said RF output signal.

6. The multimode power amplifier of claim 1, wherein said at least one driver stage comprises a bias circuit coupled to a driver amplifier, wherein said bias circuit is configured to receive a quiescent current and to provide a low impedance voltage bias to said driver amplifier in said linear and said saturated operating modes.

7. The multimode power amplifier of claim 6, wherein said bias circuit comprises a transistor configured to operate as a diode, wherein said diode provides said low impedance voltage bias.

8. The multimode power amplifier of claim 1, wherein said output stage comprises a bias circuit coupled to an output amplifier, wherein said bias circuit is configured to receive said quiescent current and to provide a low impedance voltage bias to said output amplifier in said linear and said saturated operating modes.

9. The multimode power amplifier of claim 8, wherein said bias circuit comprises a transistor configured to operate as a diode, wherein said diode provides said low impedance voltage bias.

10. An amplification module comprising:

a multimode power amplifier comprising at least one driver stage and an output stage, said output stage receiving a fixed supply voltage;

said multimode power amplifier being configured to receive an RF input signal and provide an RF output signal in linear and saturated operating modes;

a regulator providing an adjustable supply voltage to said at least one driver stage;

wherein said adjustable supply voltage controls an RF output power of said RF output signal when said multimode power amplifier is in said saturated operating mode; and wherein said adjustable supply voltage is controlled by a fixed control voltage when said multimode power amplifier is in said linear operating mode.

11. The amplification module of claim 10, wherein said at least one driver stage and said output stage are each biased by a low impedance voltage in said linear and saturated operating modes.

12. The amplification module of claim 10, wherein said regulator is controlled by an output power control voltage in said saturated mode.

13. The amplification module of claim 12, wherein output power control voltage is determined by a peak amplitude of said RF output signal.

14. The amplification module of claim 10, wherein said fixed control voltage causes said at least one driver stage to operate linearly.

15. The amplification module of claim 12 further comprising an integrator configured to receive a detected voltage and a reference voltage and provide said output power control voltage, wherein said detected voltage is proportional to a peak amplitude of said RF output signal.

16. The amplification module of claim 10 further comprising a bias control configured to receive an analog quiescent current control voltage and to provide a quiescent current to said multimode power amplifier.

17. The amplification module of claim 16 further comprising a serial port interface configured to receive a digital control signal and to provide said analog quiescent current control voltage.

18. The amplification module of claim 10 further comprising a switch, wherein said switch is configured to provide a fixed control voltage to said regulator in said linear operating mode and an output power control voltage to said regulator in said saturated operating mode.

* * * * *